(12) United States Patent
Mustonen

(10) Patent No.: US 10,598,738 B2
(45) Date of Patent: Mar. 24, 2020

(54) METHOD FOR MAINTENANCE OF A FREQUENCY CONVERTER AND SOFTWARE PROGRAM REALIZING THE SAME

(71) Applicant: KONE Corporation, Helsinki (FI)

(72) Inventor: Matti Mustonen, Helsinki (FI)

(73) Assignee: KONE CORPORATION, Helsinki (FI)

( * ) Notice: Subject to any disclaimer, the term of this patent is extended or adjusted under 35 U.S.C. 154(b) by 0 days.

(21) Appl. No.: 16/230,755

(22) Filed: Dec. 21, 2018

(65) Prior Publication Data

US 2019/0195962 A1 Jun. 27, 2019

(30) Foreign Application Priority Data

Dec. 22, 2017 (EP) ..................................... 17210313

(51) Int. Cl.
*G01R 31/42* (2006.01)
*H02M 5/458* (2006.01)
(Continued)

(52) U.S. Cl.
CPC ............ *G01R 31/42* (2013.01); *H02M 5/458* (2013.01); *H02P 27/16* (2013.01); *G01R 31/028* (2013.01)

(58) Field of Classification Search
CPC ...... H02P 1/00; H02P 1/04; H02P 1/42; H02P 1/26; H02P 1/46; H02P 3/00; H02P 3/18;
(Continued)

(56) References Cited

U.S. PATENT DOCUMENTS

| 9,535,107 B2 * | 1/2017 | Yang ..................... G01R 31/028 |
| 2014/0002104 A1 * | 1/2014 | Yang ..................... G01R 31/028 324/548 |
| 2016/0099664 A1 | 4/2016 | Niwa |

FOREIGN PATENT DOCUMENTS

| DE | 10 2013 203 299 A1 | 8/2014 |
| DE | 10 2013 211 567 A1 | 12/2014 |
| EP | 3 065 291 A1 | 9/2016 |

* cited by examiner

*Primary Examiner* — Antony M Paul
(74) *Attorney, Agent, or Firm* — Birch, Stewart, Kolasch & Birch, LLP

(57) ABSTRACT

The invention relates to a method for maintenance of a frequency converter for driving an electric motor of a transportation device, said frequency converter being supplied with AC mains power via a contactor, and including a rectifier circuit for providing a DC supply voltage, a capacitive intermediate circuit for leveling DC supply voltage, and an inverter circuit for providing power to the electric motor. In the method, after the transportation device has been vacant for a predetermined time period, said contactor is opened to disable power flow from mains supply to the frequency converter, and a test load is connected to the intermediate circuit, parallel to a capacity of the intermediate circuit. The DC supply voltage $U_{dc}(t)$ is detected, and the detected DC supply voltage $U_{dc}(t)$ is utilized for establishing a maintenance information indicating that a maintenance should be done on the frequency converter. Another aspect of the invention is a software program realizing the method when executed on a computer.

20 Claims, 4 Drawing Sheets

(51) Int. Cl.
*H02P 27/16* (2006.01)
*G01R 31/02* (2006.01)

(58) Field of Classification Search
CPC .... H02P 3/24; H02P 1/44; H02P 23/00; H02P 25/00; H02P 21/00; H02P 27/00; H02P 27/04; H02P 27/06; H02P 27/16; H02P 1/445; G01R 31/016; G01R 31/028; B60L 7/00; H02K 17/08
USPC .......... 318/400.01, 700, 701, 727, 599, 779, 318/799, 800, 801, 430, 437, 400.21, 362, 318/371, 372, 374, 375, 376, 795, 796; 701/29.1, 29.2, 31.4, 31.9, 32.7, 34.4; 324/548

See application file for complete search history.

METHOD FOR MAINTENANCE OF A FREQUENCY CONVERTER AND SOFTWARE PROGRAM REALIZING THE SAME

The present invention relates to a method for maintenance of a frequency converter for driving an electric motor of a transportation device, and a software program realizing the method.

Electric motors are used for propelling transportation devices of various kinds. A frequency converter for driving an electric motor (also known as motor drive) has typically three prominent wearing parts: a rotating cooling fan, an output bridge (also known as inverter circuit) and capacitors of an intermediate circuit (also known as DC link) which are typically electrolytic capacitors.

Typical failure modes, failure mechanisms and failure causes of an aluminum electrolytic capacitor are shown in FIG. 4 in the form of a failure matrix 400. FIG. 4 is taken from Jukka Karhimäki, "On Site Measurements of DC Link Electrolytic Capacitor Bank Of Frequency Converter Using Constant DC Magnetization Of The Motor", master's thesis, 2015, Lappeenranta University Of Technology, Faculty of Technology, Degree Programme in Electrical Engineering.

As shown in FIG. 4, two main failure modes are ESR increase, i.e., an increase in Equivalent Series Resistance (ESR) of the intermediate circuit, and capacitance drop. Failure mechanisms which all may contribute to one or both of these failure modes are:
  loss of electrolyte,
  anode foil capacitance drop,
  cathode foil capacitance drop,
  thermal decomposition of electrolyte,
  short circuit between electrodes,
  dielectrical break of oxide film,
  dielectrical break of separator paper.

For example, an electrolytic capacitor typically dries during the lifetime by 30% before it causes a failure mode in the drive. Possible causes which all may contribute to one or several or all of these failure mechanisms are:
  deterioration over time,
  excessive thermal stress,
  excessive ripple current,
  excessive operating voltage,
  applied reverse voltage,
  excessive charging/discharging
  burred foil/metal particle,
  local deficiency in oxide film,
  metal particles in separator paper,
  electrochemical reaction.

The capacitance reduction causes control instability as the resonance in the LC circuitry changes and the lowered energy storage causes faster changes in a DC supply voltage Udc when changing the operation mode between motor and generator modes.

A prior-art method for determining actual capacitance of an intermediate circuit of a motor drive is described in the aforementioned thesis by Jukka Karhumäki, based on a motor drive shown in FIG. 5A, and an operating principle shown in FIG. 5B in the form of a schematic diagram 500. As shown in FIG. 5A, the motor drive comprises a frequency converter 500 converting an AC current from a mains power supply 501 into an AC current of three phases U, V, W of a 3-phase electric motor 502. The frequency converter 500 comprises a rectifier having 6 diodes for providing a DC voltage Udc from three mains phases of the mains power supply 501, an intermediate stage having capacity C1 connected in parallel between the + and − potentials of the DC voltage Udc, and a full bridge circuit having six switches S1, . . . , S6 each connected in parallel with a freewheel diode D1, . . . , D6 for providing the three phases U, V, W out of the DC voltage Udc. As shown in FIG. 5A, the motor drive includes no braking chopper and no contactor for connecting/disconnecting with/from a mains supply voltage. The prior art method includes observing the Udc voltage during a short DC magnetization of the motor. Here, only a small change in the Udc voltage could be used. Moreover, the method assumes that ESR and capacitance of the intermediate circuit are estimated during a capacitor discharge mode where the charging current id is zero so that the capacitor's current is equals the stator current is. However, as is seen from FIG. 5A, the DC circuitry is supplied by the mains 501 and is therefore charged all the time. Therefore, the assumption mentioned above is wrong. In the diagram 550 of FIG. 5B, a graph 560 represents a switching state of switches S2, 6, a graph 570 represents a switching stage of switch S1, a graph 580 represents current Is, and a graph 590 represents a DC link voltage.

In DE 10 2013 203299 A1, it is disclosed that a load is switched on in parallel to a direct current (DC) link capacitor and switched off after a predetermined waiting period. A voltage jump is determined at the DC link capacitor, when the load is switched off. A current that flows just before the switching off is determined by the load. An equivalent series resistance is determined, based on a ratio of the determined voltage jump and the determined current. It is disclosed in EP 3 065 291 A1 that a motor drive controls a frequency converter to supply power to a resistance from a DC intermediate circuit of the frequency converter, monitors a voltage of the DC intermediate circuit during the supplying of power to the resistance, and detects a disconnection of an AC phase input of the frequency converter from the AC supply. In US 2016/099664 A1, a motor control apparatus is disclosed to include a PWM rectifier which converts DC power on a DC output side into AC power, a smoothing capacitor connected to a DC link on the DC output side of the PWM rectifier, a DC voltage detection unit detecting a DC voltage of the smoothing capacitor, an LCL filter connected to the AC input power supply side of the PWM rectifier, a power disconnection unit connected to an AC power supply side of the LCL filter, and a control unit which applies, when power is disconnected by the power disconnection unit, electric current to the LCL filter, and lowers the DC voltage to a desired value. In DE 10 2013 211567 A1, a method for verifying the operability of an intermediate circuit in a multi-voltage network comprising a DC-DC converter is disclosed. A fixed current is applied to the intermediate circuit and a voltage applied to the intermediate circuit is measured at successive sampling points. In US014/002014 A1, an apparatus for diagnosing a DC link capacitor is disclosed, wherein a DC voltage provided from a power supplier to a motor is controlled to have a predetermined level (or magnitude).

Another typical setup includes the frequency converter (FC) with an integrated braking chopper and a contactor to disconnect the FC from the mains. The capacitance in the intermediate circuit is hard to measure at the field using external measurements and thus the maintenance is usually done using preventive maintenance, e.g. replacing capacitors every five years irrespective of what their condition is. The condition of the capacitors is mainly affected by ambient temperature and ripple current of the capacitor and thus heavily affected with the actual operating conditions/usage of the transportation device.

An object of the present invention is to provide a simple method for maintenance of a frequency converter for driving an electric motor of a transportation device wherein a capacitor condition of the intermediate circuit is determined, without additional hardware. The object is solved by the features of independent claim 1.

A further object is to provide a software program realizing the method. The object is solved by the features of independent claim 16.

Preferred embodiments and advantageous further developments are described in the respective dependent claims.

The invention starts out from the idea that, when the elevator has been vacant for a while, the contactor is opened to disable power flow from the mains, and instead monitoring a behavior of a test load connected to the frequency converter so as to get information on whether a maintenance should be done on the frequency converter. The test load should have known properties. For example, a braking chopper could be used as a test load if it is activated as the contactor is opened to disable power flow from the mains. As the braking chopper resistance R is known, the braking chopper current $i_{BC}$ can be estimated (if not measured) with the equation $$i_{BC}(t) = \frac{U_{dc}(t)}{R} = i_C = C1\frac{dU_{dc}(t)}{dt},$$

where C1 is the capacitance to be estimated, and the ESR of the capacitor is considered negligible. An iterative algorithm can be developed when the capacitor is discharged near to the under voltage tripping level. When the estimate is calculated, the value may be sent to the data center where it may be compared to an initial value calculated during the commissioning, or a nominal value. When the capacitor value is lower than a threshold (adjustable, includes also some margin), a service need is generated to enable replacement of capacitors (or whole FC) before a functional failure would occur due to bad condition of the capacitors. It is assumed that when studied further, the internal resistance of the capacitor (ESR) can be also measured.

Inventors have observed that other kinds of test loads could be used which are connected to the intermediate circuit, parallel to a capacity of the intermediate circuit, and that the DC supply voltage $U_{dc}(t)$ is a parameter generally suitable for monitoring the behavior of the test load. E.g., if the frequency converter is four-quadrant-controlled without the braking chopper, the above idea may be adapted. I.e., the motor (i.e., motor winding(s)) can be utilized as test load as energy can be moved from the DC capacitors to the leakage and main inductance of the motor, and thus a "relative energy capacity" can be estimated if the values are available in F the frequency converter's memory or in the data center. If motor parameters are known, it is even possible to estimate absolute value of C1. Another kind of test load could be a machinery brake which is connected to the intermediate circuit. Power could be controlled to the machinery brake, e.g. by controlling a switch between the intermediate circuit and a brake coil, or to the motor winding(s).

Accordingly, a first aspect of the invention is a method for maintenance of a frequency converter configured to drive an electric motor of a transportation device, said frequency converter being supplied with AC mains power via a contactor, and including a rectifier circuit for providing a DC supply voltage, a capacitive intermediate circuit for leveling DC supply voltage, and an inverter circuit for providing power to the electric motor. The method comprises:

after the transportation device has been vacant for a predetermined time period, opening said contactor to disable power flow from mains supply to the frequency converter;

connecting a test load to the intermediate circuit, parallel to a capacity of the intermediate circuit;

detecting the DC supply voltage $U_{dc}(t)$; and utilizing the detected DC supply voltage $U_{dc}(t)$ for establishing a maintenance information indicating that a maintenance should be done on the frequency converter, the maintenance information being established before a failure arises, wherein the test load is one of a braking chopper circuit, a machinery brake, and a motor winding, wherein the maintenance information is indicative of a certain kind and/or severity of problem of the frequency converter, wherein the established maintenance information is transferred or made accessible to a remote maintenance center or a mobile service unit or a local control unit of the transportation device, depending on the kind and/or severity of problem indicated by the maintenance information.

The test load is one of a braking chopper circuit, a machinery brake, and a motor winding. For example, connecting the test load may include activating a braking chopper circuit included in the frequency converter for dissipating electric energy.

The method may further comprise monitoring and/or storing patterns of the detected DC supply voltage $U_{dc}(t)$, and utilizing the monitored and/or stored DC supply voltage patterns for establishing the maintenance information. For example, a trend in the monitored and/or stored DC supply voltage patterns may be determined, and the maintenance information may be established if the trend in the DC supply voltage patterns is judged to be abnormal. In another example, a difference between the monitored and/or stored DC supply voltage pattern and an initial voltage pattern of the particular frequency converter may be compared, and the maintenance information may be established if the difference is judged to have reached a predetermined threshold value or limit. Further by example, a rate of voltage change $$\frac{dU_{dc}(t)}{dt}$$

in the monitored and/or stored DC supply voltage pattern may be determined, and the maintenance information may be established if the rate of voltage change is judged to have reached a predetermined threshold value. Of course, other ways of utilizing the monitored and/or stored DC supply voltage patterns for establishing the maintenance information may be conceivable, and several ways may be combined with each other.

The method may further comprise:

estimating a capacitance of the intermediate circuit based on the detected DC supply voltage $U_{dc}(t)$; and establishing the maintenance information if the estimated capacitance of the intermediate circuit is judged to have reached a predetermined threshold value.

Here, the method may further comprise detecting a test load current $i_{test}(t)$ flowing in the test load, wherein the capacitance C of the intermediate circuit is estimated based on the equation $$i_{test(t)} = C\frac{dU_{dc}(t)}{dt}.$$

If the test load is the braking chopper circuit, the capacitance of the intermediate circuit may be estimated based on the equation $$\frac{U_{dc}(t)}{R_{BC}} = C\frac{dU_{dc}(t)}{dt},$$

where $R_{BC}$ is the resistance of the braking chopper.

If the test load is the machinery brake, the capacitance of the intermediate circuit may be estimated based on the equation $$\frac{U_{dc}(t_0)}{\sqrt{R_{MB}^2 - \frac{4L_{MB}}{C}}}\left(e^{\left(\frac{-\sqrt{R_{MB}^2 - \frac{4L_{MB}}{C}} - R_{MB}}{2L_{MB}}\right)t} - e^{\left(\frac{\sqrt{R_{MB}^2 - \frac{4L_{MB}}{C}} - R_{MB}}{2L_{MB}}\right)t}\right) = C\frac{dU_{dc}(t)}{dt},$$

where $U_{dc}(t_0)$ is the voltage of the DC circuit at the moment when the test load is connected, $R_{MB}$ is the resistance of the machinery brake, and $L_{MB}$ is the inductance of the machinery brake.

If the test load is the motor winding, the capacitance of the intermediate circuit may be estimated based on the equation $$\frac{U_{dc}(t_0)}{\sqrt{R_{MW}^2 - \frac{4L_{MW}}{C}}}\left(e^{\left(\frac{-\sqrt{R_{MW}^2 - \frac{4L_{MW}}{C}} - R_{MW}}{2L_{MW}}\right)t} - e^{\left(\frac{\sqrt{R_{MW}^2 - \frac{4L_{MW}}{C}} - R_{MW}}{2L_{MW}}\right)t}\right) = C\frac{dU_{dc}(t)}{dt},$$

where $R_{MW}$ is the resistance of the motor winding and $L_{MW}$ is the inductance of the motor winding.

The method may further comprising detecting temperature information on the test load, and determining resistance and/or inductance parameters based on the detected temperature information. By this measures, establishing the maintenance information may be further enhanced.

Also, if the test load is a motor winding or a machinery brake, the method may further comprise:
controlling the frequency converter so that current can flow through the test load;
detecting the DC supply voltage $U_{dc}(t)$ at a time $t=t_0$;
detecting the current $i(s)$ of the test load; and
estimating the capacitance C1 of the intermediate circuit based on the transformation $$i(s) = \frac{C1 U_{dc}(t_0)}{LC1s^2 + RC1s + 1},$$

where s is the complex variable used for Laplace transformed functions, i(s) is the current of the test load, C is the capacitance of the intermediate capacitor, L is either the inductance of the machinery brake or the main inductance of the motor, and R is either the resistance of the machinery brake or the resistance of the motor winding.

By the methods of the afore-described aspects, the intermediate capacitor condition can be determined (estimated) using existing hardware, with or without a braking chopper circuit. The determined value(s) can be delivered to a data center and used in a Condition Based (aka predictive) Maintenance (CBM) to optimize replacement intervals so that full lifetime is used and no functional failures shall occur.

The aforementioned threshold value may be set to be a predetermined fraction or percentage of an initial value or a nominal value of the capacitance of the intermediate circuit.

Furthermore, the threshold value may be chosen such that the maintenance information is established before a failure or problem arises.

In the aforementioned methods and according to the invention, the maintenance information is indicative of a certain kind and/or severity of failure or problem of the frequency converter. Here, the established maintenance information is transferred or made accessible to a remote maintenance center or a mobile service unit or a local control unit of the transportation device, depending on a kind and/or severity of failure or problem indicated by the maintenance information. I.e., said maintenance information may be a control signal to the local control unit, or a service needs report (message) to the remote maintenance center or directly to a serviceman.

The comparing and establishing steps may be executed at a remote monitoring unit or data analysis platform which preferably is located in a cloud computing system.

Furthermore, the determining and estimating steps may be executed at a local control unit of the transportation device.

In the aforementioned methods, the electric motor may be a permanent magnet synchronous motor.

In the aforementioned methods, the inverter circuit may include a multiple-phase full-H-bridge circuit of semiconductor power switching elements.

In the aforementioned methods, the transportation device may be selected from one of an elevator, an escalator, a moving walkway, a cablecar, a railway locomotive, a railcar, a roller coaster, a conveyor, a crane, a positioning unit, and combined systems of a plurality of single units of the same.

Another aspect of the invention is a software program realizing any of the aforementioned methods when executed on a computer. The computer is preferably a distributed computing system part of which being located in a cloud computing system. The software program may be embodied as a computer program product or a data carrier carrying data representing the software program.

Another aspect of the aforementioned method according to the invention is that establishing the maintenance information includes defining a maintenance action and/or scheduling the maintenance action or another maintenance action. Examples of maintenance actions include: changing of the intermediate circuit capacitance/capacitor, changing the intermediate circuit/module of the frequency converter, and/or changing the frequency converter. The at least one maintenance action may be defined and/or scheduled in the cloud.

A service needs report may be reported to a maintenance person as a defined maintenance action. This maintenance action may include further maintenance actions defined in the service needs report. Any or all of the maintenance actions may be scheduled for the maintenance person to notice when the respective maintenance action becomes pertinent. For example, a service needs report on an elevator X1 may include: Check frequency converter (FC) as intermediated capacitor appears to degrade, and replace capacitor(s) or whole FC. Related reports of <signals> available by selecting "Get reports".

Other aspects, features and advantages of the invention will become apparent by the below description of exemplary embodiments alone or in cooperation with the appended drawings.

Now, exemplary embodiments of the invention will be described in further detail.

Figure 1:
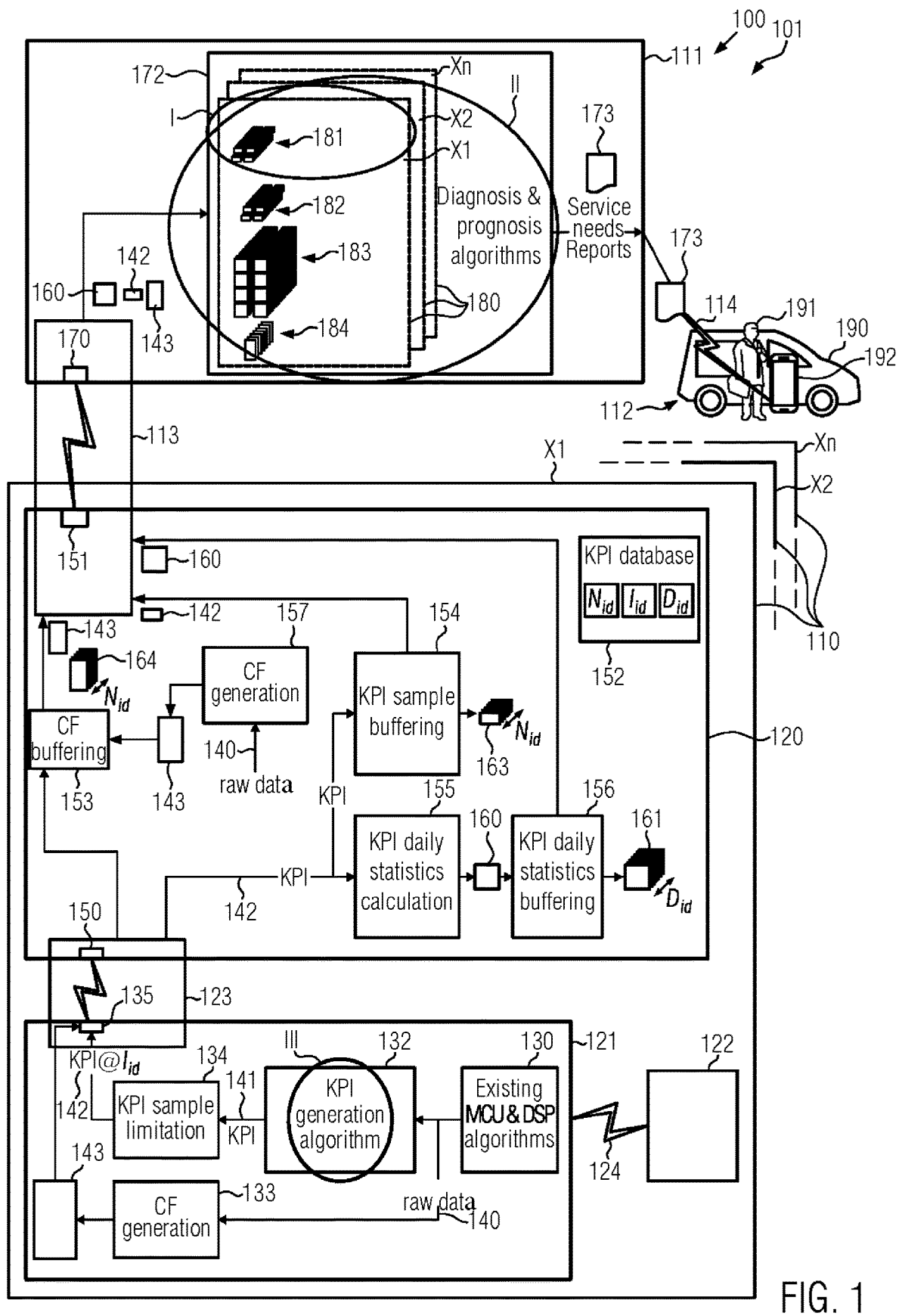
FIG. 1 is a schematic diagram of a maintenance system or method according to an exemplary embodiment of the invention.

FIG. 1 is a schematic diagram of a maintenance system 100 or method 101 according to an exemplary embodiment of the invention. It will be noted that elements shown in FIG. 1 may be realized as physical instances of the maintenance system 100, or steps of the maintenance method 101, or both.

The system 100 or method 101 is for maintenance of an elevator 110. There may be only one elevator in the system, but there may also be a multiplicity of elevators 110. For distinguishing elevators 110 from each other, each elevator 110 is designated a unique number, herein exemplified as X1, X2, . . . , Xn. In other words, there are n elevators 110 in the system, with n being 1, 2, or more.

A remote monitoring unit 111 is for monitoring each elevator 110 through diagnosis and prognosis algorithms which will be described later, and is in contact with a service unit 112. Even if only one service unit 112 is shown, more than one service unit 112 may be present. A device link 113 is for communication between the remote monitoring unit 111 and the elevator(s) 110, and a service link 114 is for communication between the remote monitoring unit 111 and the service unit(s) 112.

Each elevator 110 comprises a local control unit 120, a drive control board 121, and a motor drive 122 controlled by the drive control board 121, for moving an elevator car or cabin (not shown). A control link 123 is for communication between the local control unit 120 and the drive control board 121, and a drive link 124 is for connecting the drive control board 121 with the motor drive 122. The motor drive 122 may e.g. be a frequency converter converting three-phase mains voltage/current into three-phase motor voltage/current of a hoisting motor of the elevator 110, under control of the drive control board 121. Even if only one drive control board 121 and one motor drive 122 are shown, an elevator may have more than one cars, and a car may have one or more hoisting motors. So each car may be assigned one or more motor drives 122, and each motor drive 122 is assigned to one drive control board 121. However, one drive control board 121 may be responsible for one or more motor drives 122 of one or more elevator cars.

In this exemplary embodiment, the service link 114 is based on a mobile communications protocol, the device link 113 is based on SAG, wherein any other wireless or wired communication protocol is possible, the control link 123 is based on LON or device protocol, and the drive link 124 is based on a KDSC, wherein any serial communication protocol is possible. It will be thus noted that any other useful protocol may be used as needed.

The drive control board 121 includes a drive control 130 for executing MCU and DSP algorithms which per se are known in the art, for driving switches of the motor drive 122, a KPI generation 132, a CF generation 133, a KPI sample limitation 134, and an uplink interface 135 of the control link 123.

There are many signals calculated in the motion control and torque control algorithms located in the drive control 130. The drive control 130 therefore does see and handle many control values as it is controlling the motion of the hoisting machine and these signals can be used to evaluate condition of many system components. Many of these values are calculated either in real-time or after each travel and thus there would be lots of data generated if the values should be transferred to a remote server for analysis and maintenance purposes. A diagnostics framework has been developed to reduce data sent to a server and this framework shall be extended to a drive software as well. This specification describes what data is generated in a box marked with circles I, II, III for condition-based maintenance (CBM) purposes.

The signals calculated, detected or generated in the drive control 130 are passed, as a plurality of raw data 140, to the KPI generation 132 and CF generation 133. The KPI generation 132 has algorithms which generate so-called "Key Performance Indicators" (KPI) 141 from the raw data 140, and the CF generation 133 has algorithms which generate so-called "Condition files" (CF) 143 from the raw data 140. A KPI 141 may have the following structure:

<KPI sample 141>
1) timestamp
2) sample

A condition file 143 may have the following structure:
<Condition file (CF) 143>
header (timestamp, source)
data1, data2
2.123,134.345
2.278,127.780

It will be noted that numerical values in the condition file 143 above have no particular meaning in the context of the present invention and are purely by example. The condition file 143 may in general be referred to as a condition information, and the KPI sample 141/142 may in general be referred to as a performance information. Here, both KPIs and CFs can be used as condition and performance signals.

The condition files 143 are directly passed to the uplink interface 135 to be communicated to the local control unit 120, such as an elevator control unit. The KPIs 141 are passed to the KPI sample limitation 134 to generate a limited or selected KPI sample collection (KPI@$I_{id}$) 142 of the individual drive control board 121. The selected KPI samples 142 are then passed to the uplink interface 135 to be communicated to the local control unit 120.

The local control unit 120 has a downlink interface 150 of the control link 123, an uplink interface 151 of the device link 113, a KPI database 152, a CF buffering 153, a KPI sample buffering 154, a KPI daily statistics calculation 155, a KPI daily statistics buffering 156, and a CF generation 157. The local control unit 120 can produce KPIs also ("KPI generation algorithm").

The downlink interface 150 is for exchanging data with the drive control board 121, via the control link 123. The uplink interface 151 is for exchanging data with the remote monitoring unit 111, via the device link 113.

The KPI database 152 is for storing individual KPI samples 141 or KPI samples 142. The KPI database 152 may include a data structure including structured data relating to KPI samples and/or statistics, a memory area provided at the local control unit 120 for storing such data structure, and/or a process performing a database management method for managing such data structure.

The CF buffering 153 is for buffering condition files 143 passed from the drive control board 121 and other condition files 143 generated at the local control unit 120 itself, in a condition file stack 164, and passing the same to the uplink interface 151.

The KPI sample buffering 154 is for buffering selected KPI samples 142 passed from the drive control board 121 in a KPI sample stack 163, and passing the same to the uplink interface 151.

The KPI daily statistics calculation 155 is for calculating daily statistics files 160 from the KPI samples 142 passed from the drive control board 121, and passing the same to the KPI daily statistics buffering 156. A KPI daily statistics file 160 may have the following structure:

<KPI daily statistics file>
1) timestamp
2) minimum
3) maximum
4) average
5) standard deviation
6) amount of samples The KPI daily statistics buffering 156 is for buffering KPI daily statistics files 160 calculated in the KPI daily statistics calculation 155, in a KPI daily statistics stack 161 and passing the same to the uplink interface 151. The KPI daily statistics files 160 may in general be referred to as statistics information. It will be noted that also CF daily statistics files (not shown) may contribute to statistics information.

The CF generation 157 is for generating further condition files 143 from raw data 140 handled within local control unit 120. The generated condition files 143 are also passed to CF buffering 153 to be processed as described above.

The remote monitoring unit 111 has a downlink interface 170 of the device link 113, a diagnosis and prognosis 172, and an interface (not shown) of the service link 114. The diagnosis and prognosis 172 receives selected KPI samples 142, condition files 143 and KPI daily statistics files 160 from the downlink interface 170, to be provided at device images 180 which are provided for each single elevator 110 identified by each one's respective unique number X1, X2, ..., Xn. The selected KPI samples 142 are gathered at the KPI daily statistics stack 161 and/or at the KPI sample stack 163. The latest KPI samples 142 can be fetched without being stacked. Each device image 180 includes an events and statistics history 181, a KPI history 182, a KPI statistics history 183, and a raw data history 184. It is seen that also raw data 140 may be passed via the links 123, 113 to the remote monitoring unit 111, even if not shown in the drawing. The diagnosis and prognosis section 172 has diagnosis and prognosis algorithms which apply diagnosis and prognosis processes to each device image's 180 data for generating a service needs report 173 relating to an elevator 110 if the diagnosis and prognosis processes conclude that a service is needed at the respective elevator 110. The service needs report 173 is then passed to the mobile service unit 112 via service link 114.

The service unit 112 may comprise a service car 190 operated by a serviceman 191, and comprises a communication device 192 such as a cellphone, car phone, smartphone, tablet, or the like. The service link 114 is established between the remote monitoring unit 111 and the communication device 192 of the service unit. If the service needs report 173 is received at the communication device 192, an alert is given so that the serviceman 191 will take notice, read the service needs report 173, and execute the service need at the elevator 110 the service needs report 173 directs to.

It will be noted that any measured/determined parameters related to drive control of a motor drive 122 of a hoisting motor (not shown) of the elevator 110 may be raw data 140, and a wide variety of parameters may be derived therefrom as key performance indicator (KPI) sample 141/142 or condition file 143. Accordingly, any KPI samples 141/142 and any condition file 143 may be further processed as described above. In other words, daily statistics 160 may be generated, history data 181-184 may be collected to provide an image of each elevator 110 in the system, and diagnosis and prognosis algorithms may be applied, to generate a service need report 173 if a problem is predicted to likely occur soon.

It will be noted that no additional hardware is needed for this estimations but the condition files 141 and/or KPI samples 141/142 can be determined (estimated) using existing hardware. Already with existing software, several drive signals may be derived which may be useful as raw data 140. The determined value(s) can be delivered to a data center (remote monitoring unit 111) and used in a Condition Based (aka predictive) Maintenance (CBM) to optimize replacement intervals so that full lifetime is used and no functional failures shall occur.

Figure 2:
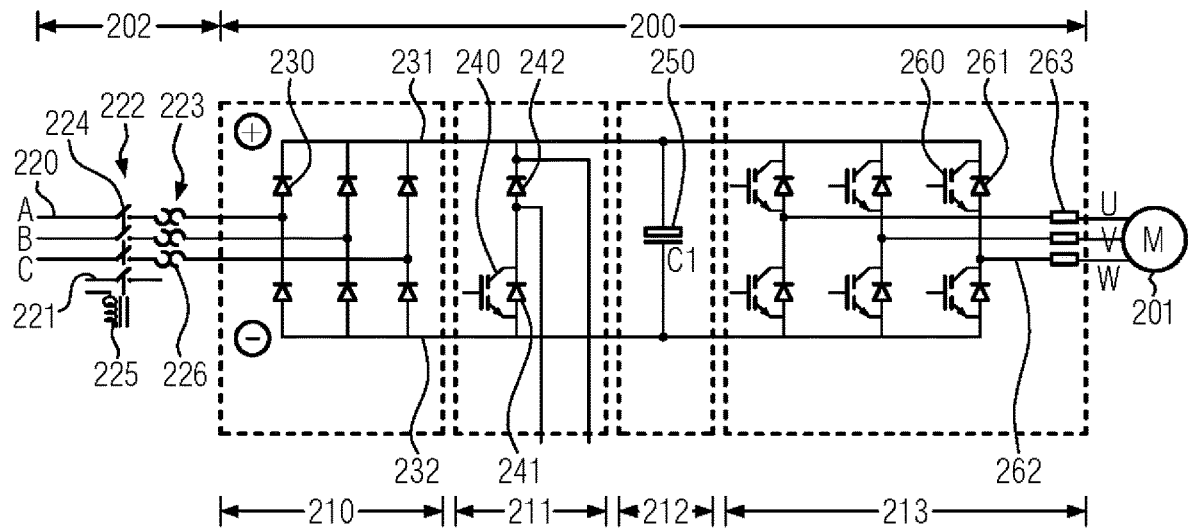
FIG. 2 is a schematic diagram of a frequency converter providing phase currents to an electric motor from a mains supply.

The motor drive 122 includes or is embodied by a frequency converter 200 as seen in FIG. 2. In FIG. 2, elements are schematically illustrated, and may be simplified to some extent so as to focus the illustration to the parts useful for describing the invention.

The frequency converter 200 is for converting an AC multi-phase (3-phase) supply voltage from a main power supply 202 into an AC multi-phase (3-phase) motor voltage for an electric motor 201. Motor 201 is a hoisting motor of an elevator car (not shown) of elevator 110 (FIG. 1). The electric motor 201 has three phases U, V, W and may be a permanent magnet synchronous motor.

The main power supply 202 has three mains phases 220 individually indicated A, B, C, and a mains ground 221, a relay unit 222 and a transformer unit 223. The relay unit 222 comprises a solenoid 225 and individual contactors 224 for each mains phase 220 and the mains ground 221. The transformer unit 223 comprises individual transformers 226 for each mains phase 220 transforming a mains supply voltage thereof into an operational voltage.

The frequency converter 200 comprises a rectifier circuit 210, a braking chopper circuit 211, a capacitive intermediate circuit 212, and an inverter circuit 213.

The rectifier circuit 210 comprises individual pairs of serially connected rectifier diodes 230 for each transformed mains phase 220, rectifying AC voltage thereof into a DC operational voltage $U_{dc}$, thereby defining an intermediate high potential 231 on the positive side (+) and an intermediate low potential 232 on the negative side (−).

The braking chopper circuit 211 comprises a chopper switch 240 with a flywheel diode 241, and an chopper diode 242 in series with the flywheel diode 241. The chopper switch 240 is a semiconductor switch, preferably field effect transistor, e.g. IGBT.

The capacitive intermediate circuit 212 comprises an intermediate capacitor 250 of capacity C1. The capacitive intermediate circuit 212 may include a capacitive network of a plurality of capacitors and other elements which the intermediate capacitor 250 may be equivalent to. In other words the capacity C1 of the capacitor 250 is an equivalent capacity of the intermediate circuit 212.

The inverter circuit 213 comprises individual pairs of inverter switches 260 for each phase U, V, W of the motor, thereby establishing a full-H-bridge circuit, each with a flywheel diode 261. Inverter phases 262 are provided with respective phase output resistors 263 to end in the motor phases U, V, W. The inverter switches 260 are semiconductor power switches, preferably field effect transistors, e.g. IGBTs.

Gates of the inverter switches 260 as well as a gate of the brake switch 240 and the solenoid 225 of the relay unit 222 are driven by motor drive 122 (FIG. 2).

Figure 3:
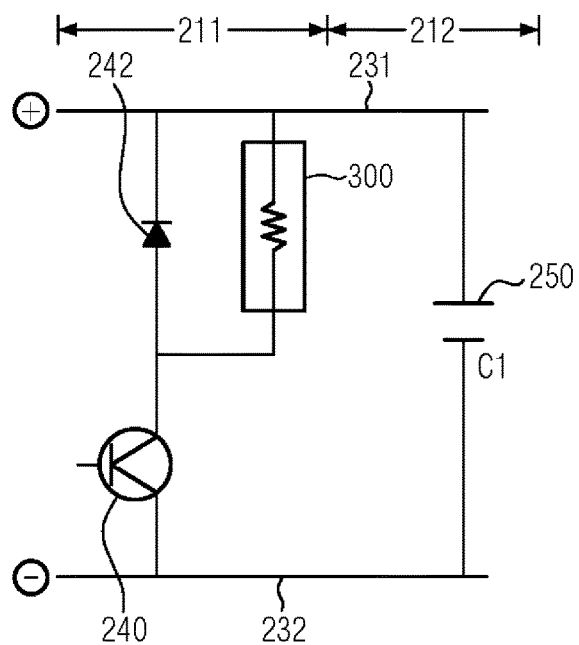
FIG. 3 is a schematic diagram of a braking chopper and an intermediate circuit.
Figure 4:
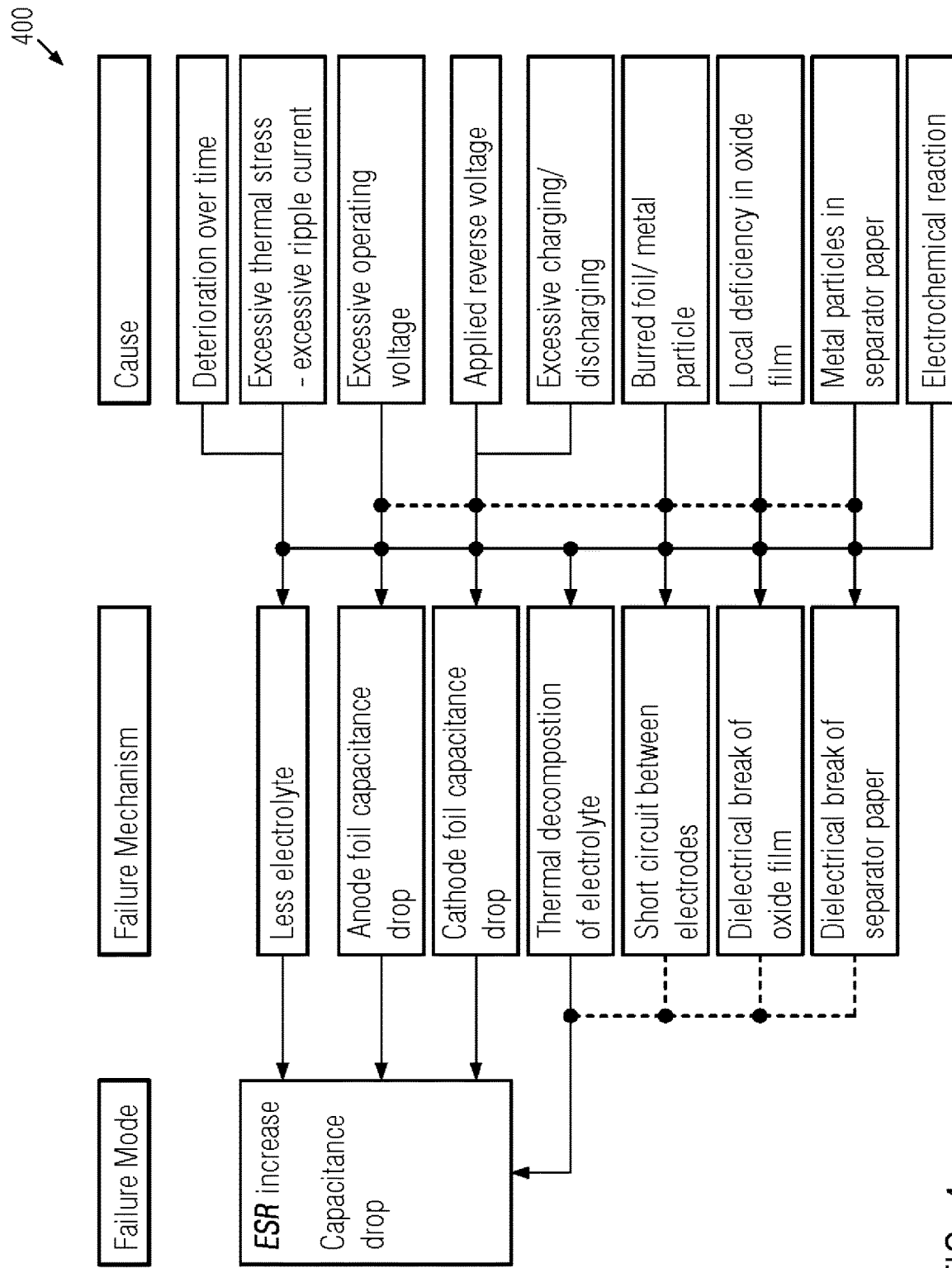
FIG. 4 is a failure matrix showing typical failure modes, failure mechanisms and failure causes of an aluminum electrolytic capacitor.
Figure 5A:
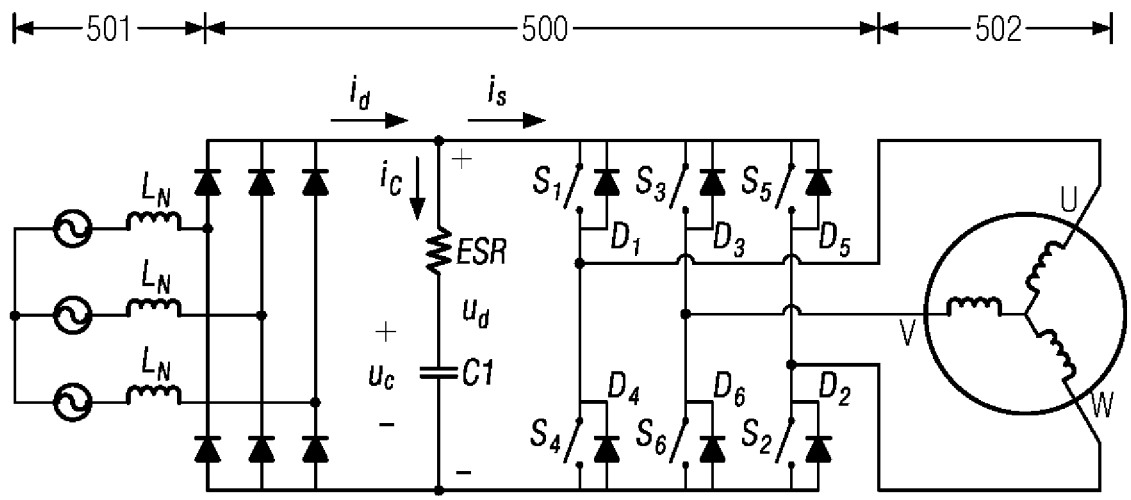
FIG. 5A is a schematic diagram of a frequency converter providing phase currents to an electric motor from a mains supply.
Figure 5B:
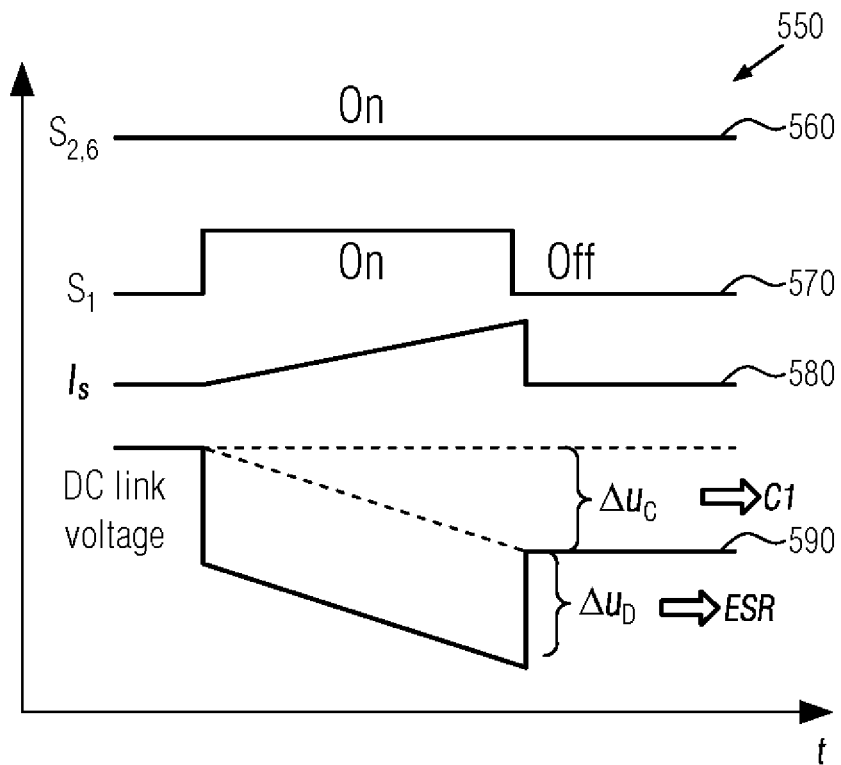
FIG. 5B is a schematic diagram including graphs for illustrating an operating principle of a prior-art method.

The braking chopper circuit 211 may be constructed differently from the above. For example, the flywheel diode may be omitted, and a resistor 300 may be provided in parallel with the chopper diode 242 (FIG. 3).

The maintenance method 101 may include estimating a capacitance C1 of the intermediate circuit 212 and utilizing it for establishing a maintenance information indicating that a maintenance should be done on the frequency converter 200. For estimating capacitance C1, this application provides three options.

In a first option, when the elevator 100 has been vacant for a while, contactors 224 of the relay unit 222 are opened to disable power flow from the mains phases 220, and the braking chopper 211 is activated by triggering chopper switch 240. As the braking chopper resistance R is known, the braking chopper current $i_{BC}$ can be estimated (if not measured) with the equation $$i_{BC}(t) = \frac{U_{dc}(t)}{R} = i_C = C1\frac{dU_{dc}(t)}{dt},$$

where C1 is the capacitance of the intermediate circuit 212 to be estimated, and the ESR (equivalent series resistance) of the capacitor 250 (i.e., the capacitive intermediate circuit 212) is considered negligible. An iterative algorithm can be developed when the capacitor 250 is discharged near to the under voltage tripping level.

Accordingly, in this option, after the elevator 100 has been vacant for a predetermined time period, the contactors 224 are opened to disable power flow from mains supply 220 to the frequency converter 200, and said braking chopper 211 is activated. Then, DC supply voltage $U_{dc}(t)$ is detected, as a raw data 140 as shown in FIG. 1, which can easily be differentiated to determine a voltage change $$\frac{dU_{dc}(t)}{dt}$$

of the DC supply voltage. With known R, the capacitance C1 of the intermediate circuit 212 may be estimated based on the equation $$\frac{U_{dc}(t)}{R} = C1\frac{dU_{dc}(t)}{dt}.$$

As C1 is once estimated, it can be sent to a data center (i.e., remote monitoring unit 111) where it may be compared to an initial value calculated during the commissioning, or a nominal value. When the capacitor value C1 is lower than a threshold (adjustable, includes also some margin), a service need is generated to enable replacement of capacitors (or whole frequency converter 200) before a functional failure would occur due to bad condition of the capacitors. It is most likely that when studied further, the internal resistance of the capacitor (ESR) can be also measured.

In a second option, a braking chopper current $i_{BC}(t)$ flowing in the braking chopper circuit 211 is directly determined, and C1 is estimated based on the equation $$i_{BC}(t) = C1\frac{dU_{dc}(t)}{dt}.$$

For the rest, this option follows the first option.

A third option will be described for the case where the frequency converter 200 is four-quadrant-controlled without the braking chopper. Here, the motor can be utilized as energy can be moved from the DC capacitors to the leakage and main inductance of the motor and thus a "relative energy capacity" can be estimated if the values are available in F the frequency converter's memory or in the data center. If motor parameters are known, it is even possible to estimate absolute value of C1.

Accordingly, in this option, after the elevator 100 has been vacant for a predetermined time period and the contactors 124 have been opened, the current i(s) of a motor winding is detected, and C1 is estimated based on the equation $$i(s) = \frac{C1U_{dc}(t_0)}{LC1s^2 + RC1s + 1}\bigg|_{[PH1]}.$$

It will be noted that no additional hardware is needed for this estimations but the intermediate capacitor condition can be determined (estimated) using existing hardware. The determined value(s) can be delivered to a data center (remote monitoring unit 111) and used in a Condition Based (aka predictive) Maintenance (CBM) to optimize replacement intervals so that full lifetime is used and no functional failures shall occur.

It will be noted that measured/determined parameters like the DC supply voltage Udc(t) and/or the braking chopper current $i_{BC}(t)$ and/or stator current $i_s(t)$ are raw data (140 in FIG. 1), and estimated C1 is a key performance indicator (KPI) sample (141 in FIG. 1). Accordingly, the KPI samples 141 may be further processed as described above in the context of FIG. 1. Alternatively, estimated C1 may be handled as condition file 143 and further processed as described above in the context of FIG. 1. In other words, daily statistics 160 may be generated, history data 181-184 may be collected to provide an image of each elevator 100 in the system, and diagnosis and prognosis algorithms may be applied, to generate a service need report 173 if a problem is predicted to likely occur soon.

The remote monitoring unit 111 may be included in a cloud computing architecture or other distributed architecture. I.e., at least parts of diagnosis and prognosis section 172 may be distributed, e.g., to a data analysis platform and a maintenance unit located at different computers in a cloud. The KPI daily statistics data 160 are sent e.g. on a daily basis to the data analysis platform which in turn generates trend information. Trend information may be generated such that a decreasing trend can be detected and a maintenance action can be triggered before failure of the intermediate capacitor 250 or the whole frequency converter 200 takes place, which would prevent elevator operation. To this end, trend information may be sent to the maintenance unit for analyzation. If the maintenance unit detects that a maintenance action is needed, it generates either a maintenance instruction and passes it to the local control unit 120 in case maintenance can be executed by useful control signaling to the drive control 130 or others, or generates a service needs report 173 and passes it to service unit 112 as described above. In the present case, the service needs report may e.g. read something like "[Service needs report on elevator X1:] Check frequency converter (FC) as intermediated capacitor appears to degrade, and replace capacitor(s) or whole FC. Related reports of <signals> available by selecting "Get reports".

In this manner, the estimated intermediate circuit capacitance C1 is utilized for establishing a maintenance information indicating that a maintenance should be done on the transportation device (elevator) 110.

This application focuses on condition monitoring of the intermediate circuit capacitance C1. On the other hand, a similar monitoring system may be utilized for analysis of other data also.

Even if the invention was described above based on elevators, as a matter of example, the invention is applicable to any transportation system using an electric motor for moving a moving part of the transportation system. The moving part may be a cabin of an elevator, a car of a roller coaster, a moving stairway or walkway, a locomotive of a railway, or others.

It is to be noted that the monitoring interval may be other than daily, i.e., may be shorter such as twice daily, hourly, or less such as even after every run, or may be longer such as twice weekly, weekly, monthly, or more.

A technical feature or several technical features which has/have been disclosed with respect to a single or several embodiments discussed herein before, e. g. the service car 190 in FIG. 1 may be present also in another embodiment e. g. when maintenance is carried out on the frequency converter shown in FIG. 2 except it is/they are specified not to be present or it is impossible for it/them to be present for technical reasons.

LIST OF REFERENCE SIGNS

100 Maintenance system
101 Maintenance method
110 Transportation device (e.g., elevator)
111 Remote monitoring unit (cloud computing system)
112 Service unit
113 Device link
114 Service link
120 Local control unit
121 Drive control board
122 Motor drive (frequency converter)
123 Control link
124 Drive link
130 Drive control (Existing MCU & DSP algorithms)
132 KPI generation
133 CF generation
134 KPI sample limitation
135 Uplink interface
140 Raw data
141 Key performance indicator (KPI)
142 KPI sample
143 Condition file (CF)
150 Downlink interface
151 Uplink interface
152 KPI database
153 CF buffering
154 KPI sample buffering
155 KPI daily statistics calculation
156 KPI daily statistics buffering
157 CF generation
160 KPI daily statistics file
161 KPI daily statistics stack
163 KPI sample stack
164 CF stack
170 Downlink interface
171 Communication link
172 Diagnosis & prognosis section
173 Service needs report
180 Device images
181 Events & statistics history
182 KPI history
183 KPI statistics history
184 Raw data history
190 Service car
191 Serviceman
192 Communication device
200 Frequency converter (Motor drive)
201 Electric motor
202 Main power supply
210 Rectifier circuit
211 Braking chopper circuit
212 Capacitive intermediate circuit
213 Inverter circuit
220 Mains phase (A, B, C)
221 Mains ground
222 Relay unit
223 Transformer unit
224 Contactor
225 Solenoid
226 Transformer
230 Rectifier diode
231 Intermediate high potential
232 Intermediate low potential
240 Chopper switch
241 Flywheel diode
242 Chopper diode
250 Intermediate capacitor (C1)
260 Inverter switch
261 Flywheel diode
262 Inverter Phase
263 Phase output resistor
300 Chopper resistance
400 Failure matrix
500 Frequency converter
501 Mains power supply
502 Electric motor
550 Capacitance determining method
560 Graph (S2,6)
570 Graph (S1)
580 Graph (Is)
590 Graph (DC link voltage)

ic capacitor current
id charging current
is stator current
A,B,C Mains supply phases
C1 Capacitance of intermediate circuit
D1, . . . D Inverter flywheel diodes
ESR Equivalent series resistance
U,V,W Motor phases
$L_N$ Phase inductivity
M Motor
S1, . . . S6 Inverter switches
Udc DC operational voltage
The above list is an integral part of the description.

The invention claimed is:

1. Method for maintenance of a frequency converter configured to drive an electric motor of a transportation device, said frequency converter being supplied with AC mains power via a contactor, and including a rectifier circuit for providing a DC supply voltage, a capacitive intermediate circuit for leveling DC supply voltage, and an inverter circuit for providing power to the electric motor, wherein said method comprises:
after the transportation device has been vacant for a predetermined time period, opening said contactor to disable power flow from mains supply to the frequency converter;
connecting a test load to the intermediate circuit, parallel to a capacity of the intermediate circuit;
detecting the DC supply voltage $U_{dc}(t)$; and
utilizing the detected DC supply voltage $U_{dc}(t)$ for establishing a maintenance information indicating that a maintenance should be done on the frequency converter, the maintenance information being established before a failure arises, wherein the test load is one of a braking chopper circuit, a machinery brake, and a motor winding, wherein the maintenance information is indicative of a certain kind and/or severity of problem of the frequency converter, wherein the established maintenance information is transferred or made accessible to a remote maintenance center or a mobile service unit or a local control unit of the transportation device, depending on the 25 kind and/or severity of problem indicated by the maintenance information.

2. The method of claim 1, wherein connecting the test load includes activating a braking chopper circuit included in the frequency converter for dissipating electric energy.

3. The method of claim 2, further comprising monitoring and/or storing patterns of the detected DC supply voltage $U_{dc}(t)$, and utilizing the monitored and/or stored DC supply voltage patterns for establishing the maintenance information, preferably by at least one of:
determining a trend in the monitored and/or stored DC supply voltage patterns, and establishing the maintenance information if the trend in the DC supply voltage patterns is judged to be abnormal,
comparing a difference between the monitored and/or stored DC supply voltage pattern and an initial voltage pattern of the particular frequency converter, and establishing the maintenance information if the difference is judged to have reached a predetermined threshold value; and
determining a rate of voltage change $$\frac{dU_{dc}(t)}{dt}$$

in the monitored and/or stored DC supply voltage pattern, and establishing the maintenance information if the rate of voltage change is judged to have reached a predetermined threshold value.

4. The method of claim 2, further comprising:
estimating a capacitance of the intermediate circuit based on the detected DC supply voltage $U_{dc}(t)$; and
establishing the maintenance information if the estimated capacitance of the intermediate circuit is judged to have reached a predetermined threshold value.

5. The method of claim 1, further comprising monitoring and/or storing patterns of the detected DC supply voltage $U_{dc}(t)$, and utilizing the monitored and/or stored DC supply voltage patterns for establishing the maintenance information, preferably by at least one of:
determining a trend in the monitored and/or stored DC supply voltage patterns, and establishing the maintenance information if the trend in the DC supply voltage patterns is judged to be abnormal,
comparing a difference between the monitored and/or stored DC supply voltage pattern and an initial voltage pattern of the particular frequency converter, and establishing the maintenance information if the difference is judged to have reached a predetermined threshold value; and
determining a rate of voltage change $$\frac{dU_{dc}(t)}{dt}$$

in the monitored and/or stored DC supply voltage pattern, and establishing the maintenance information if the rate of voltage change is judged to have reached a predetermined threshold value.

6. The method of claim 5, further comprising:
estimating a capacitance of the intermediate circuit based on the detected DC supply voltage $U_{dc}(t)$; and
establishing the maintenance information if the estimated capacitance of the intermediate circuit is judged to have reached a predetermined threshold value.

7. The method of claim 1, further comprising:
estimating a capacitance of the intermediate circuit based on the detected DC supply voltage $U_{dc}(t)$; and
establishing the maintenance information if the estimated capacitance of the intermediate circuit is judged to have reached a predetermined threshold value.

8. The method of claim 7, further comprising detecting a test load current $i_{test}(t)$ flowing in the test load, wherein the capacitance C of the intermediate circuit is estimated e. g. based on the equation $$i_{test(t)} = C\frac{dU_{dc}(t)}{dt}.$$

9. The method of claim 7, wherein, if the test load is the braking chopper circuit, the capacitance C of the intermediate circuit is estimated e. g, based on the equation $$\frac{U_{dc}(t)}{R_{BC}} = C\frac{dU_{dc}(t)}{dt},$$

where $R_{BC}$ is the resistance of the braking chopper.

10. The method of claim 9, further comprising detecting temperature information on the test load, and determining resistance of the braking chopper $R_{BC}$ based on the detected temperature information.

11. The method of claim 7, further comprising:
   establishing a rate of change of the intermediate circuit capacitance based on estimated capacitances of the intermediate circuit; and
   establishing the maintenance information if the established rate of change of the intermediate circuit capacitance is judged to have reached a predetermined threshold value.

12. The method of claim 7, wherein the threshold value is set to be a predetermined fraction or percentage of an initial value or a nominal value of the capacitance of the intermediate circuit.

13. The method of claim 7, wherein the threshold value is chosen such that the maintenance information is established before the failure arises.

14. The method of claim 7, wherein if the test load is a motor winding or a machinery brake, the method further comprises:
   controlling the frequency converter so that current can flow through the test load;
   detecting the DC supply voltage at a time t=t0 Ud(t);
   detecting the current i(s) of the test load; and estimating the capacitance C1 of the intermediate circuit based on the transformation, where s is the complex variable used for Laplace transformed functions, i(s) is the current of the test load, C is the capacitance of the intermediate capacitor, L is either the inductance of the machinery brake or the main inductance of the motor, and R is either the resistance of the machinery brake or the resistance of the motor winding.

15. The method of claim 7, wherein if the test load is the machinery brake, the capacitance of the intermediate circuit is estimated based on the equation $$\frac{U_{dc}(t_0)}{\sqrt{R_{MB}^2 - \frac{4L_{MB}}{C}}}\left(e^{\left(\frac{-\sqrt{R_{MB}^2 - \frac{4L_{MB}}{C}} - R_{MB}}{2L_{MB}}\right)t} - e^{\left(\frac{\sqrt{R_{MB}^2 - \frac{4L_{MB}}{C}} - R_{MB}}{2L_{MB}}\right)t}\right) = C\frac{dU_{dc}(t)}{dt}$$

where $U_{dc}(t_0)$ is the voltage of the DC circuit at the moment when the test load is connected, $R_{MB}$ is the resistance of the machinery brake, and $L_{MB}$ is the inductance of the machinery brake, or, if the test load is the motor winding, the capacitance of the intermediate circuit is estimated based on the equation $$\frac{U_{dc}(t_0)}{\sqrt{R_{MW}^2 - \frac{4L_{MW}}{C}}}\left(e^{\left(\frac{-\sqrt{R_{MW}^2 - \frac{4L_{MW}}{C}} - R_{MW}}{2L_{MW}}\right)t} - e^{\left(\frac{\sqrt{R_{MW}^2 - \frac{4L_{MW}}{C}} - R_{MW}}{2L_{MW}}\right)t}\right) = C\frac{dU_{dc}(t)}{dt}$$

where $R_{MW}$ is the resistance of the motor winding and $L_{MW}$ is the inductance of the motor winding.

16. The method of claim 7, wherein the comparing and establishing steps are executed at a remote monitoring unit or data analysis platform which preferably is located in a cloud computing system.

17. The method of claim 7, wherein the determining and estimating steps are executed at a local control unit of the transportation device.

18. The method of claim 1, wherein the transportation device is selected from one of an elevator, an escalator, a moving walkway, a cablecar, a railway locomotive, a railcar, a roller coaster, a conveyor, a crane, a positioning unit, and combined systems of a plurality of single units of the same.

19. The method of claim 1, wherein establishing the maintenance information includes defining a maintenance action and/or scheduling the maintenance action or another maintenance action.

20. A software program realizing the method according to claim 1 when executed on a computer, wherein the computer is preferably a distributed computing system part of which being located in a cloud computing system.

* * * * *